(12) United States Patent
Lakshmanan et al.

(10) Patent No.: US 7,853,901 B2
(45) Date of Patent: Dec. 14, 2010

(54) UNIFIED LAYER STACK ARCHITECTURE

(75) Inventors: Viswanathan Lakshmanan, Thornton, CO (US); Thomas R. O'Brien, Windsor, CO (US); Richard D. Blinne, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 270 days.

(21) Appl. No.: 12/109,501

(22) Filed: Apr. 25, 2008

(65) Prior Publication Data

US 2009/0271755 A1    Oct. 29, 2009

(51) Int. Cl.
G06F 17/50 (2006.01)
(52) U.S. Cl. .............................. 716/1; 716/13
(58) Field of Classification Search .............. 716/1, 716/13
See application file for complete search history.

(56) References Cited

U.S. PATENT DOCUMENTS

| | | | |
|---|---|---|---|
| 2003/0067075 A1* | 4/2003 | Fukasawa | 257/758 |
| 2005/0198608 A1* | 9/2005 | Brown | 716/20 |
| 2006/0165813 A1* | 7/2006 | Dangel et al. | 424/641 |
| 2008/0201685 A1* | 8/2008 | Selvaraj | 716/19 |
| 2009/0134909 A1* | 5/2009 | Madurawe | 326/38 |

* cited by examiner

Primary Examiner—Jack Chiang
Assistant Examiner—Suchin Parihar
(74) Attorney, Agent, or Firm—Luedeka, Neely & Graham, P.C.

(57) ABSTRACT

A method for producing a family of digital integrated circuit designs, where the family has a highest level design and at least one lower level design. The highest level design is first produced. Then, in a programmed computing system without user intervention, the highest level design is automatically processed to selectively remove at least one predetermined metal layer. A closest remaining overlying layer to the at least one removed metal layer is automatically mapped to a closest remaining underlying layer to the at least one removed metal layer, thereby producing the at least one lower level design.

20 Claims, 1 Drawing Sheet

UNIFIED LAYER STACK ARCHITECTURE

FIELD

This invention relates to the field of integrated circuit design. More particularly, this invention relates to the design of integrated circuit layer stacks.

BACKGROUND

Integrated circuits can be designed digitally, meaning that their designs are primarily contained in computer files, rather than as graphics that are drawn on pieces of paper or some other hardcopy.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

The digital design files for integrated circuits are typically stored in a format that is specific to the computer aided design (CAD) tool that is used to create the digital integrated circuit design. These CAD tools are made by a variety of companies, such as Mentor, Cadence, Avanti, and Magma, each of which has their own proprietary file format. These tool-specific formats are generally referred to herein as internal formats and internal files.

When the design process is complete (or believed to be), the digital integrated circuit design is recorded and delivered to the fabrication facility in a process called tapeout. The tapeout file is produced by the CAD tool, which takes the internal format file and produces a file in a standardized format that is not proprietary to any specific tool. For example, the most common file format is based on the Graphic Data System, commonly called GDS II. Tapeout can also be made to other standardized formats, such as the Library Exchange Format (LEF) or the Design Exchange Format (DEF). These open standard formats are generally referred to herein as external formats and external files.

The external file is received by the fabrication facility where, typically, some type of verification of the digital design is performed. For example, as integrated circuits get smaller and more complex, it becomes more difficult to ensure that a digital design does not violate any of the possibly many hundreds of design rules that are imposed to ensure that the integrated circuit functions properly. To ensure that the design rules are not violated, a design rule checking routine (DRC) can be run on the digital design, which will flag any violations of the design rules. For present purposes, the tool on which DRC is performed is called a DRC tool.

In addition, a layout versus schematic (LRC) comparison routine can be run on the digital design (perhaps after fixing any design rule violations previously flagged), which finds problems with the design having to do with issues such as lithographic effects like proximity correction. For present purposes, the tool on which LRC is performed is called an LRC tool. When the errors in the external file that are found by these and other such routines have been fixed, then the digital design is ready to move into prototyping.

For present purposes, the design of an integrated circuit as accomplished in the CAD tool can be divided into two groups. The first group includes the designs of structures that are formed within the semiconducting substrate, and the second group includes the designs of structures that are formed on top of the semiconducting substrate. The structures in this second group are often individually referred to as layers, and a specific combination of the layers that are required for a given integrated circuit design are often referred to as a stack. Again for present purposes, the layers of the stack as described herein are limited to the electrically conductive layers that are typically formed of a metal. Thus, the layer stack is the part of the integrated circuit that provides most of the electrical connections in the integrated circuit.

According to the broadly adopted Taiwan Semiconductor Company (TSMC) design rules, layers are further divided into two groups. The first group includes the so-called thin layers, and the second group includes the so-called thick layers. There may be five, six, or seven thin layers used in a given layer stack design, and one or two thick layers. The thin layers are disposed in a numbered order, layers 1-7 for example, one on top of another nearest the substrate. The thick layers are disposed on top of the thin layers, also in a numbered order. For example, if two thick layers are used on top of five thin layers in a given design, then the designation for the layer stack would be 5+2, where the 5 refers to the number of underlying thin layers, and the +2 refers to the number of overlying thick layers. A film stack typically has at least five thin layers, where the lower-most five layers are typically substantially the same from design to design within an integrated circuit design family. Similarly, a film stack typically has at least one thick layer.

Within a given stack, the thin layers are actually thinner than the thick layers. However, the actual thicknesses of these layers tend to be relative within a given stack, rather than absolute. Therefore, to avoid confusion, and for present purposes, the thin metal layers are generally referred to herein as bottom metal layers, since they reside near the bottom of the stack, and the thick metal layers are generally referred to herein as top metal layers, since they reside near the top of the stack.

Design engineers create very specific digital integrated circuit designs in the CAD tool. For example, if a given integrated circuit design family includes one integrated circuit or one group of integrated circuits with a 5+1 stack, another with a 5+2 stack, and others each with a 6+1 stack, a 6+2 stack, a 7+1 stack, and finally a 7+2 stack, then the designer must individually create six different stack designs in the CAD tool for that integrated circuit family.

In the example above, it is possible for a first given integrated circuit design within the family to have as few as six metal layers (5+1) and for a second given integrated circuit design within the family to have as many as nine metal layers (7+2). However, in the first design, the sixth metal layer, for example (generally referred to with the notation M6—indicating the sixth metal layer), is a top metal layer (the +1 top metal layer in the 5+1 notation), and in the second design the sixth metal layer (also M6) is a bottom metal layer (the sixth of the 7 bottom metal layers in the 7+2 notation). Designs with more metal layers are referred to herein as higher level designs, and designs with less metal layers are referred to herein as lower level designs.

Thus, according to the TSMC design rules, the M6 layer of the first design is taped out with a code that identifies it as a top metal layer, while the M6 layer of the second design is taped out with a code that identifies it as a bottom metal layer. Thus, the tapeout process for these different designs produces external files that are also highly specific to the integrated circuit design, and an M6 layer in one design might be completely different from an M6 layer in another design, even within the same integrated circuit design family.

Creating more designs costs more money in engineering time and in tool-use time, and the greater number of designs is more difficult and costly to maintain. Further, if a new stack design is desired at a later point in time, the design engineer must return to the CAD tool and manually produce and tapeout the new design.

What is needed, therefore, is a system that reduces problems such as those described above, at least in part.

SUMMARY

The above and other needs are met by a method for producing a family of digital integrated circuit designs, where the family has a highest level design and at least one lower level design. The highest level design is first produced. Then, in a programmed computing system without user intervention, the highest level design is automatically processed to selectively remove at least one predetermined metal layer. A closest remaining overlying layer to the at least one removed metal layer is automatically mapped to a closest remaining underlying layer to the at least one removed metal layer, thereby producing the at least one lower level design.

In this manner, the design engineer only needs to produce the highest level design for the integrated circuit design family, and thereafter the programmed computing system can automatically produce without user intervention and or all of the lower level designs that might be needed. The lower level designs can all be produced at once, or can be produced at any time thereafter, as they become needed. However, in either event, there is no need for the design engineer to return to the CAD tool and manually create any of the lower level designs.

In various embodiments according to this aspect of the invention, the highest level design is produced in a CAD tool. The highest level design is processed in an internal file format in some embodiments, and an external file format in other embodiments. Similarly, the lower level design is produced in an internal file format in some embodiments, and an external file format in other embodiments. In some embodiments the at least one removed metal layer includes only power routing and ground routing and does not include any signal routing. In some embodiments the highest level design includes exactly seven bottom metal layers and exactly two top metal layers. In some embodiments no more than one top metal layer from the highest level design is removed, and in some embodiments no more than two bottom metal layers from the highest level design are removed. In various embodiments the programmed computing system is one or more of the CAD tool, a DRC tool, or a LVS tool. In some embodiments a plurality of lower level designs is produced by selectively removing a different number of predetermined metal layers from the highest level design to produce each of the plurality of lower level designs. The highest level design in some embodiments is a 7+2 TSMC design and the at least one lower level design is at least one of a 7+1, 6+2, 6+1, 5+2, and 5+1 TSMC design. In some embodiments the first five metal layers are identical between the highest level design and the at least one lower level design.

According to another aspect of the invention there is described a computing apparatus for producing a family of digital integrated circuit designs, where the family has a highest level design and at least one lower level design. An input receives the highest level design, and a processor selectively removes at least one predetermined metal layer from the highest level design, and maps a closest remaining overlying layer to the at least one removed metal layer to a closest remaining underlying layer to the at least one removed metal layer. An output provides the at least one lower level design.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figures 1, 2:
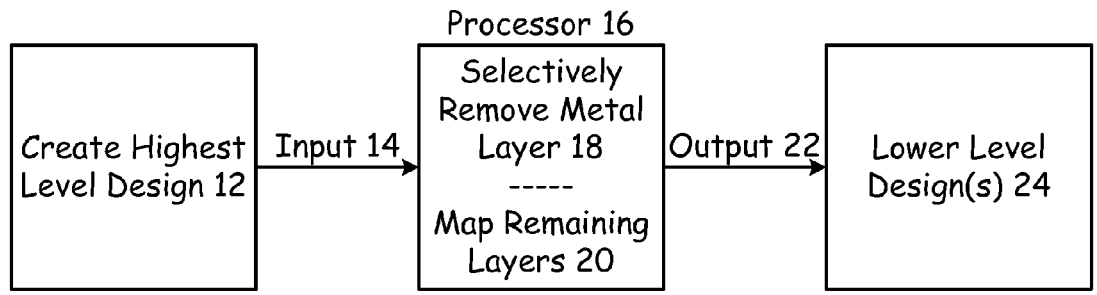
FIG. 1 is a combination function block diagram and flowchart of the method and the apparatus used to perform the functions described herein according to an embodiment of the present invention.
FIG. 2 is a chart of an integrated circuit digital design family according to an embodiment of the present invention.

With reference now to FIG. 1, there is depicted a combination function block diagram and flowchart of the method/apparatus 10 used to perform the functions described herein according to an embodiment of the present invention. In general terms, the highest level design is first created, as given in block 12. The highest level design is provided on an input 14 to a programmed computing device with a processor 16, that selectively removes one or more metal layer, as given at 18, and then maps the remaining layers to function one with another, as given at 20. This produces one or more lower level design 24, that are provided on an output 22 of the computing device. These general aspects of the invention are described in more detail hereafter.

The computing system 10 operates in some embodiments in an automated manner, without user intervention, which saves engineering time. Further, the method can be implemented at any time as desired, thus removing any need to maintain multiple designs until any additional such designs are needed.

In various embodiments, the system 10 is a part of one or more of the CAD tool, the DRC tool, or the LVS tool. Alternately, the system 10 is a stand-alone computing device (in regard to the DRC, LVS, and CAD tools), such as a personal computer, workstation, mainframe, or network computing structure.

In some embodiments the highest level design 12 is in the internal format of the CAD tool, which file is read by the system 10 to produce the lower level designs 24 in one or more external format. In other embodiments, the system 10 reads the highest level design 12 in an external format, and then produces the lower level designs 24 in the same or a different external format. It is appreciated that many different permutations of input file format and output file format are comprehended herein.

With reference now to FIG. 2, there is depicted a chart representing a specific example of an embodiment of the present invention. As depicted in FIG. 2, the design level designation for a specific integrated circuit design within a family of integrated circuit designs is specified across the top of the chart. These designs are specified using the TSMC numbers for the bottom metal layers and the top metal layers. It is appreciated that other aspects of the integrated circuit design may or may not be changed, in one design from another.

The 7+2 design is produced first. The 7+2 design in this example is the highest level design, so-named because there are no other designs in this integrated circuit family that have either more bottom metal layers or more top metal layers. Thus, by designing the 7+2 level, all of the bottom metal layers and all of the top metal layers for each of the lower level designs in the integrated circuit family are also substantially specified.

The chart of FIG. 2 also indicates along the left-hand side an absolute reference to the metal layer of the particular integrated circuit design within the family. For example, in the row labeled M1-M5, the X in each box indicates that in this example all six of the design levels within the family include these first five bottom metal levels. Conversely, an O in a given box indicates that the level design indicated at the top of the column for that box does not include the metal layer indicated at the left of the row for that same box. For example, design level 5+2 does not include the M6 layer as created for the 7+2 design.

Thus, to create the 5+1 design from the 7+2 design, three different metal layers are removed, which in this example are the M6, M7, and M9 layers. In some embodiments, only one or both of the M6 and M7 layers and only the M9 layer are selectively removed to form the lower design levels. Thus, in these embodiments, the M1-M5 layers are all substantially identical. In other embodiments, however, other metal layers, or additional metal layers can be selectively removed. In the example as depicted, the M1 through M7 layers are bottom metal layers, and the M8 and M9 layers are top metal layers.

In some embodiments, only those layers that route power and ground are removed, and those layers that route signals are not removed. It is appreciated that an upper layer will tend to have signal vias through it, at the very least, to pass the signal connections up to the topmost metal layer, and that these and similarly relatively minor signal connections are not considered sufficient to designate a given layer as a signal routing layer herein. In other embodiments, signal routing layers, as defined herein, can also be selectively and automatically removed by the system 10.

Also in the example as depicted in FIG. 2, the M8 layer (as originally designated) is selectively and automatically modified by the system 10 during the creation of the lower level designs. This modification is generally referred to as mapping herein, and is designated by an M in the box for those design levels where the M8 layer is mapped. The mapping process includes making relatively slight modifications to the layout of the given layer, such as adjusting vias that make contact with lower layers, where one or more of the immediately underlying layers have been removed, and thus a new via configuration is required.

For example, in the 5+1 design level, both the M7 and M6 layers have been removed, and so the original M8 layer (which becomes the M6 layer, the topmost layer of this design), must be modified to form proper via connections to the M5 layer, which is now the immediately underlying layer. Further, because the old M8 layer of the 5+1 design level is now also the uppermost layer of the design, it could be modified such as to remove vias that are designed to provide electrical connections to an overlying metal layer (since there is no overlying metal layer any more). In addition, some other modifications might be made such as to provide conductive lands for external electrical connections to the integrated circuit.

These modifications of the original M8 layer can be decided upon in advance of their actual need, during the design phase of the highest level design, so that when the system 10 performs the layer removal 18 and mapping 20, no intervention by the user is required to map the layers to the new design. Alternately, the system 10 can be preprogrammed with a set of design rules to perform the mapping and adjustment as generally described above, so as to conform to desired design practices.

In the example as depicted in FIG. 2, it is the original M8 layer that must be retained and mapped for all of the lower level designs. In other embodiments the M8 layer can also be removed, and whatever layer is left over the top of one or more removed layers is mapped to interface with the remaining next-closest underlying layer. Also, whatever layer is now the topmost layer, it is also mapped so as to reflect its status as the topmost layer, as described above. In some embodiments, the layer that is overlying removed layers, and the layer that is a new topmost layer, are one and the same layer, and thus only one layer needs to be mapped. In other embodiments these layers are two different layers, in which case both layers can be selectively mapped, as desired. In still other embodiments, it is the first metal layer that is left remaining underneath the removed layers that is modified to accommodate its newly overlying layer. Thus, different embodiments are contemplated herein.

The benefit in any of these situations is that these mapping operations are much simpler than designing a metal layer from scratch, and the mapping operations can thus be performed automatically and without user intervention by the system 10, thus realizing the benefits as generally described above.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for producing a family of digital integrated circuit designs, where the family has a highest level design and at least one lower level design, the method comprising the steps of:
   producing the highest level design,
   in a programmed computing system without user intervention,
      automatically processing the highest level design to selectively remove at least one predetermined metal layer, and
      automatically mapping a closest remaining overlying layer to the at least one removed metal layer to a closest remaining underlying layer to the at least one removed metal layer,
   thereby producing the at least one lower level design.

2. The method of claim 1, wherein the highest level design is produced in a CAD tool.

3. The method of claim 1, wherein the highest level design is processed in an internal file format.

4. The method of claim 1, wherein the highest level design is processed in an external file format.

5. The method of claim 1, wherein the at least one lower level design is produced in an internal file format.

6. The method of claim 1, wherein the at least one lower level design is produced in an external file format.

7. The method of claim 1, wherein the at least one removed metal layer includes only power routing and ground routing and does not include any signal routing.

8. The method of claim 1, wherein the highest level design includes exactly seven bottom metal layers and exactly two top metal layers.

9. The method of claim 1, wherein no more than one top metal layer from the highest level design is removed.

10. The method of claim 1, wherein no more than two bottom metal layers from the highest level design are removed.

11. The method of claim 1, wherein the programmed computing system is the CAD tool.

12. The method of claim 1, wherein the programmed computing system is a DRC tool.

13. The method of claim 1, wherein the programmed computing system is a LVS tool.

14. The method of claim 1, wherein a plurality of lower level designs is produced by selectively removing a different number of predetermined metal layers from the highest level design to produce each of the plurality of lower level designs.

15. The method of claim 1, wherein the highest level design is a 7+2 TSMC design and the at least one lower level design is at least one of a 7+1, 6+2, 6+1, 5+2, and 5+1 TSMC design.

16. The method of claim 1, wherein the first five metal layers are identical between the highest level design and the at least one lower level design.

17. A method for producing a family of digital integrated circuit designs, where the family has a highest level design and at least one lower level design, the method comprising the steps of:
  producing the highest level design to include seven bottom metal layers and two top metal layers,
  in a programmed computing system without user intervention,
  automatically processing the highest level design to selectively remove at least one predetermined metal layer, where the at least one predetermined metal layer is selected from the group consisting essentially of no more than both of an upper two of the seven bottom metal layers and no more than one of the two top metal layers, and
  automatically mapping a closest remaining overlying layer to the at least one removed metal layer to a closest remaining underlying layer to the at least one removed metal layer,
  thereby producing the at least one lower level design.

18. The method of claim 17, wherein the at least one removed metal layer includes only power routing and ground routing and does not include any signal routing.

19. The method of claim 17, wherein the at least one lower level design includes all of a 7+1, 6+2, 6+1, 5+2, and 5+1 TSMC design.

20. A computing apparatus for producing a family of digital integrated circuit designs, where the family has a highest level design and at least one lower level design, the computing apparatus comprising:
  an input adapted to receive the highest level design,
  a processor adapted to,
    selectively remove at least one predetermined metal layer from the highest level design, and
    map a closest remaining overlying layer to the at least one removed metal layer to a closest remaining underlying layer to the at least one removed metal layer, and
  an output adapted to provide the at least one lower level design.

* * * * *